United States Patent [19]

Takagi

[11] Patent Number: 5,686,839
[45] Date of Patent: Nov. 11, 1997

[54] EQUIPMENT AND METHOD FOR DETECTING ELECTRICAL LEAKAGE IN ELECTRIC VEHICLE

[75] Inventor: Nobuyoshi Takagi, Toyota, Japan

[73] Assignee: Toyota Jidosha Kabushiki Kaisha, Toyota, Japan

[21] Appl. No.: 394,276

[22] Filed: Feb. 24, 1995

[30] Foreign Application Priority Data

Feb. 24, 1994 [JP] Japan ................... 6-026942

[51] Int. Cl.$^6$ .................................. G01M 15/00
[52] U.S. Cl. ...................... 324/503; 324/510; 324/522
[58] Field of Search ........................ 324/503, 509, 324/528, 522, 523, 545, 713, 772, 768, 510; 361/42, 44–47; 364/483, 424.04, 424.03, 550, 551.01, 431.11, 431.12

[56] References Cited

U.S. PATENT DOCUMENTS

| | | | |
|---|---|---|---|
| 5,382,946 | 1/1995 | Gale | 340/650 |
| 5,481,194 | 1/1996 | Schantz et al. | 324/522 |
| 5,510,725 | 4/1996 | Schantz, Jr. et al. | 324/768 |
| 5,530,360 | 6/1996 | Kerchaert et al. | 324/503 |

FOREIGN PATENT DOCUMENTS

| | | |
|---|---|---|
| 56-9068 | 7/1969 | Japan. |
| 61-16761 | 5/1986 | Japan. |

*Primary Examiner*—Vinh P Nguyen
*Attorney, Agent, or Firm*—Oblon, Spivak, McClelland, Maier & Neustadt, P.C.

[57] ABSTRACT

An equipment and method for detecting electrical leakage in an electric vehicle. For detecting occurrence of leakage in an alternating-current motor for driving the vehicle, a source-side transistor of an inverter is turned ON and a sink-side transistor is turned OFF. When leakage occurs in the motor, there arises an electrical path to an electric leakage detector through the grounded portion from the transistor on the source-side, the motor winding, and the leakage portion. Due to a current flowing in the electrical path, the electrical leakage detector determines that the leakage is present, and the result is notified to the ECU (electronic control unit). On the contrary, the source-side and sink-side may preferably be turned OFF and ON respectively. It is unnecessary to turn ON all the source-side or all the sink-side transistors. The leakage in the motor can be detected without misinterpreting noise on the battery-side as viewed from the inverter.

17 Claims, 6 Drawing Sheets

EQUIPMENT AND METHOD FOR DETECTING ELECTRICAL LEAKAGE IN ELECTRIC VEHICLE

BACKGROUND OF THE INVENTION

I. Field of the Invention

This invention relates to an electrical leakage detecting equipment for detecting a leakage of electricity in an alternating-current motor which is mounted on an electric vehicle using the alternating-current motor as a vehicle driving motor, and relates to a method of detecting a leakage of electricity using the equipment.

II. Description of the Prior Art

An electric vehicle has a vehicle driving motor, a battery for supplying a driving electric power to the motor, and various kinds of electric power circuits for controlling an output of the motor. The electric power components such as the battery and the electric power circuits are components in connection with generation, transfer, and conversion and the like of the electric power for rotatably driving the motor. Therefore, once a leakage of electricity (an electrical leakage) arises in an electric power component of this kind, a state where a required electric power is not supplied to the vehicle driving motor may occur. For this reason, there have conventionally been proposed various means of detecting electrical leakage in the electric power components mounted on the vehicle and notifying the occurrence of such to a vehicle driver or the like.

The equipment, which is disclosed in Japanese Utility Model Publication Sho-61-16761, is mounted on the electric vehicle which uses a direct-current motor as a driving motor. In the arrangement of using the direct-current motor as a driving motor, as shown in the publication, an output of the motor is controlled by means of a chopper circuit etc. for controlling an electric power which is supplied to the motor from a battery on the vehicle. In the electrical leakage detecting equipment disclosed in the publication, when the battery on the vehicle is charged using electric power from outside of the vehicle, the occurrence of electrical leakage from the battery on the vehicle is detected as a current flowing on a vehicle body. The electrical leakage detecting equipment disclosed in the publication, upon occurrence of an electrical leakage, notifies such a fact to the vehicle driver or the like, thereby the vehicle driver promptly executes a countermeasure to be taken by himself (for example, contacting a repair shop or dealer) upon occurrence of that electrical leakage.

On the other hand, the alternating-current motor is superior to the direct-current motor in view of efficiency or the like, and thus is presently widely utilized as a driving motor of an electric vehicle. In the use of the alternating-current motor as a vehicle driving motor, the electrical power discharged from the battery of the vehicle is required to be converted into an alternating-current power. To achieve this, an inverter is usually employed. The inverter is formed of a plurality of pairs of switching elements (for example, IGBT: insulated gate bipolar transistor). The inverter converts the direct-current power supplied from the battery of vehicle into the alternating-current power by switching the operation of these switching elements. The alternating-current power thus obtained by the conversion is supplied to the driving motor as a driving electric power. Here, the switching operation of each switching element is controlled in accordance with a value of torque to be output from the motor so as to obtain a required output torque from the driving motor from the electric power supplied to the driving motor.

However, when the alternating-current motor is used as a driving motor, it is difficult to secure a sufficient time period for exactly detecting generation of the electrical leakage in the motor, from the input-side (battery-side) of the inverter.

SUMMARY OF THE INVENTION

A first object of the invention is to suitably detect a leakage of electricity in an alternating-current motor used as a driving motor from the input-side of the inverter. A second object of the invention is to prevent the erroneous interpreting of noise as the leakage. A third object of the invention is to realize an inexpensive electrical leakage detecting equipment without providing a high speed detecting function. A fourth object of the invention is to achieve the objects as formerly described without interference to operation of the vehicle, in particular, without interference to a torque control of the driving motor. A fifth object of the invention is to achieve the objects as formerly described without addition of new circuit elements to the conventional inverter. A sixth object of the invention is to achieve the objects as formerly described, without generation of a torque in the driving motor although a current flows through the inverter according to the circumstances on detecting the leakage of electricity.

A first aspect of the invention is a method of detecting-leakage of electricity, which is executed in an electric vehicle, the electric vehicle comprising a battery, an alternating-current motor that is a driving source of the electric vehicle, and an electric power conversion equipment which is inserted between the battery and the alternating-current motor and executes electric power conversion required for power running or regeneration braking of the electric vehicle, a method of detecting a leakage of electricity comprising the steps of, detecting a state where the electric power conversion is unnecessary; forming an electrical path, in the case where it is detected that the electric power conversion is unnecessary, which includes the battery, the electric power conversion equipment, and the alternating-current motor and maintains an open state as long as the alternating-current motor does not generate a leakage of electricity; detecting that a current flows in the electrical path; and determining that, in the case where it is detected that the current flows in the electrical path, the electrical path is closed by the electrical leakage path produced in the alternating-current motor.

According to the invention, first, when the electric power conversion by an electric power conversion equipment is unnecessary, for example, when the vehicle stops, the process relating to the electrical leakage detection is executed. The state where an electric power conversion by the electric power conversion equipment, for example an inverter, is unnecessary, can be detected, for example, in accordance with a speed of the electric vehicle, a requirement of accelerating, starting, and braking given by operations such as accelerating or braking, and a request of a neutral range given by a shift operation and the like.

On detecting the electrical leakage, an electric path maintaining an open state as long as an electrical leakage does not arise in the alternating-current motor is first formed. This electric path includes the battery, electric power conversion equipment and the alternating-current motor. On occurrence of the electrical leakage in the alternating-current motor, the electric path is closed through the vehicle body or the like of the electric vehicle. On closing of the electric path, due to an electromotive force of the battery a current flows through the electric path. Such current can be detected by a component belonging to the electric path, for example, by a predetermined circuit existing on the battery-side viewed from the electric power conversion equipment.

The electrical leakage detection is executed within a predetermined limit time so as to shorten a required time while securing a certain level of accuracy. Once the electrical leakage is detected, the countermeasure to the electrical leakage, for example, information or alarm, is executed. After the countermeasure to the electrical leakage is executed or if such leakage is not detected, an execution is made for an operation prohibiting the electric power conversion, for example, for a control for turning OFF all the switching elements constituting the electric power conversion equipment. This turn-OFF control enables switching into a state of motor stop after processing the electrical leakage.

In this arrangement, a generation of the electrical leakage in the alternating-current motor used as a driving motor, can be detected from the input-side of the inverter. The electrical leakage detection process is performed, as described above, in the period when the electric power conversion by the electric power conversion equipment is unnecessary, thus, such leakage detection process is performed without interference to the operation of the vehicle, particularly, without interference to the torque control of the driving motor, in addition, without being affected by noise produced following the electric power conversion. Furthermore, because the electrical leakage detection process is performed in the period when the electric power conversion is unnecessary, it is unnecessary to perform the electrical leakage detection at a high speed matching to a frequency of the electric power conversion. There can be realized an electrical leakage detecting equipment with a high reliability although exhibiting a lower speed and therefore an inexpensive cost.

For the electric path formed for detecting the electrical leakage, two paths are considered; namely, the first path is a path of the vehicle body→electrical leakage detector→battery negative-side terminal→battery→battery positive-side terminal→source-side switching element of electric power conversion equipment→phase terminal of alternating-current motor→alternating-current motor; the second path is a path of the alternating-current motor→phase terminal of alternating-current motor→sink-side switching element of electric power conversion equipment→battery negative-side terminal→battery→battery positive-side terminal→electrical leakage detector→vehicle body.

The positive-side and negative-side terminals of the battery mentioned here is taken to mean terminals for connecting the battery with the direct-current-side of the electric power conversion equipment. The phase terminal of the alternating-current motor is taken to mean a terminal for connecting each phase winding of the alternating-current motor with the alternating-current-side of the electric power conversion equipment, and generally is required to be plural in number. A plurality of pairs of source-side switching elements and the sink-side switching elements are provided in order to correspond to either one of the phase terminals. The source-side switching element is provided for opening and closing the connection of the corresponding phase terminal with the positive-side terminal of the battery, and the sink-side switching element is provided for opening and closing the connection of the corresponding phase terminal with the negative-side terminal of the battery. The electrical leakage detector may preferably be connected across the positive-side terminal and the negative-side terminal of the battery through a resistance, and grounded on the vehicle body. Accordingly, if the electrical leakage arises in the alternating-current motor on forming the electric path as described, the alternating-current motor and the vehicle body are electrically connected by the electrical leakage path, and a closed circuit is formed.

As a procedure sufficient to form the first path as above, the positive-side terminal and the phase terminal are connected by the source-side switching elements and then the negative-side terminal and the phase terminal are insulated by the sink-side switching elements. At this time, to open the electric path to be formed as long as the leakage occurs, all the sink-side switching elements are required to stay insulated. In contrast, for the source-side switching elements, it is enough that at least one of them is connected. One or ones subjected to the connecting operation may preferable be changed alternatively. Of course, all the source-side switching elements may be connected. To form the second path, the positive-side terminal and all the phase terminals are insulated by all of the plurality of source-side switching elements, and the negative terminal and at least one terminal of the plurality of phase terminals may be connected by at least one of the plurality of sink-side switching elements. In this arrangement, the same argument as is the case of the first path is established only by replacing the "source" with "sink". Furthermore, the one or more switching elements may be selected on the basis of all the switching elements without distinguishing "source-side" and "sink-side" and the selected switching element or elements may be alternatively changed. In this case, the electric path to be formed comes to either one of the first or second path depending on an arrangement in which the selected switching element or elements are on the source-side or sink-side. However, when selecting a plurality of elements at the same time, they are all made to belong to the same-side.

The source-side switching element and the sink-side switching element as described may be dedicated to forming an open electric path used for electrical leakage detecting. However, it is advantageous that the switching element essentially constituting the electric power conversion equipment, in other words, the switching element for executing the electric power conversion is used to produce the open electric path for the electrical leakage detecting. This is because there is an inexpensive manufacturing cost and research and development manhours as no new circuit element is added to the conventional electric power conversion equipment, for example, to the inverter. A further merit, namely that a torque is not generated in the alternating-current motor, is provided, even if the switching element for executing the electric power conversion is used to form the open electric path for the electrical leakage detecting. In concrete, first, the electric path as described does not allow a current to flow, due to being open as long as an electrical leakage does not occur. Secondly, even if the electrical leakage arises to allow the current to flow, since all the switching elements in either one of the source-side or sink-side perform the insulating operation, an alternating-magnetic field is not generated in the alternating-current motor. This therefore prevents movement of the vehicle in spite of utilization of the electric power conversion equipment for detecting the electrical leakage.

A second aspect of the invention is an electrical leakage detecting equipment installed in an electric vehicle, wherein the electric vehicle includes a battery, an alternating-current motor which is a driving source of the electric vehicle, and an electric power conversion equipment positioned between a battery and the alternating-current motor for executing an electric power conversion required for power running or regeneration braking of the electric vehicle, an electrical leakage detecting equipment comprising; means for detecting a state where the electric power conversion is unnecessary; means for forming an electrical path, when a state where the electric power conversion is unnecessary is detected, which includes the battery, the electric power conversion equipment and the alternating-current motor and maintains an open state as long as the alternating-current motor does not experience a leakage of electricity; means for detecting that a current flows in the electrical path; and means for determining, in the case where it is detected that a current flows in the electrical path, that the electrical path is closed by the electrical leakage path produced in the alternating-current motor.

A third aspect of the invention is an inverter control method executed in an electric vehicle, the electric vehicle comprising; a battery having a positive-side terminal and a negative-side terminal; an alternating-current motor, having a plurality of phases, which is a driving source of the electric vehicle; and an inverter positioned between a battery and an alternating-current motor for executing an electric power conversion required for power running or regeneration braking of the electric vehicle, the inverter having a plurality of source-side switching elements, positioned between the positive-side terminal and the alternating-current motor, each corresponding to each phase of the alternating-current motor, and a plurality of sink-side switching elements, positioned between the negative-side terminal and the alternating-current motor, each corresponding to each phase of the alternating-current motor, the method comprising the steps of; detecting a state where the electric power conversion is unnecessary; selecting at least one switching element from either said plurality of source-side switching elements or said plurality of sink-side switching elements in a case where it is detected that the electric power conversion is unnecessary; forming an electrical path including the battery, the inverter and the alternating-current motor which maintains an open state as long as the alternating-current motor does not experience electrical leakage, by means of closing only a selected switching element or elements; detecting a current flowing in the electrical path; determining that the electrical path is closed by an electrical leakage path produced in the alternating-current motor when a current flowing into the electrical path has been detected; executing a process for coping with an electrical leakage when it is determined that the electrical path has been closed; and prohibiting the electric power conversion by opening all of said plurality of source-side switching elements and said plurality of sink-side switching elements after a process for coping with the electrical leakage has been executed and when it is determined that the electrical path is not closed.

DETAILED DESCRIPTION OF THE PREFERRED EMBODIMENTS

The preferred embodiments according to the invention are described in accordance with the drawings.

Figure 1:
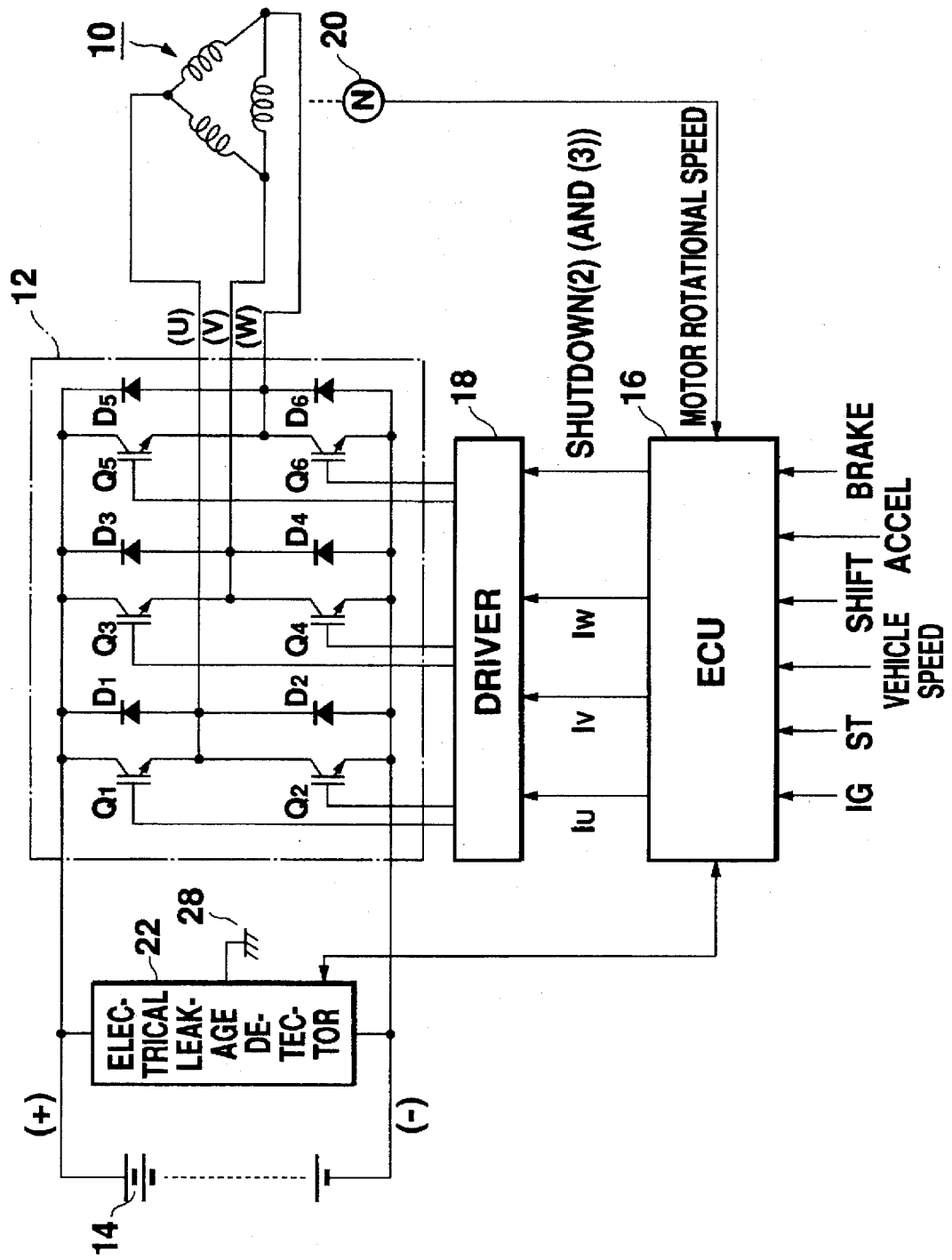
FIG. 1 is a block diagram showing a system construction of an electric vehicle according to one embodiment of the invention.

FIG. 1 shows a system constitution of an electric vehicle of one embodiment according to the invention. The electric vehicle shown in the drawing uses a three-phase alternating-current motor 10 as a vehicle driving motor.

The motor 10 receives a driving electric power from a battery 14 on the vehicle, through an inverter 12, where a discharge electric power of the battery 14 is converted into an alternating-current by the inverter 12. Namely, a direct-current voltage appeared between a positive-side terminal (+) and a negative-side terminal (−) of the battery 14 is converted into the alternating-current by the inverter 12, and supplied to the motor 10 through respective phase terminals (U), (V), (W) of the motor 10.

The inverter 12 has a total of six transistors, for example, IGBT Q1 to Q6 which are so connected as to form a bridge circuit. Collectors of transistors Q1, Q3, and Q5 belonging to an upper arm of the bridge circuit are connected to the positive terminal (+) of the battery 14. Emitters of transistors Q2, Q4, and Q6 belonging to a lower arm of the bridge circuit are connected to the negative terminal (−) of the battery 14. Emitters of three transistors Q1, Q3, Q5 belonging to the upper arm are respectively connected to the collectors of the transistors Q2, Q4, or Q6 belonging to the lower arm.

A current for the U phase terminal (U) of the motor 10 is supplied through a connecting point of transistors Q1 and Q2, a current for the V phase terminal (V) is supplied through a connecting point of the transistor Q3 and Q4, and a current for the W phase terminal (W) is supplied through a connecting point of the transistor Q5 and Q6. In this embodiment, each transistor Q1 to Q6 having a NPN type junction is used. Hence, the upper arm functions as a source, and the lower arm functions as a sink. That is to say, when supplying a driving current to the motor 10, the transistors Q1, Q3, and Q5 belonging to the upper arm are positioned on the current source-side as viewed from the motor 10, and the transistors Q2, Q4, and Q6 belonging to the lower arm are positioned on the current sink-side.

In order to convert a direct-current power supplied from the battery 14 into an alternating-current power and supply it to the motor 10, the transistors Q1 to Q6 are allowed to be turned ON/OFF so that transistors forming a pair with each other are not turned ON simultaneously, and the transistors to be turned ON is alternated. In concrete, the control for the transistors Q1 to Q6 proceeds, at a certain instant, to turn ON transistors Q1, Q4, and Q6 and to turn OFF the other transistors, and at a following instant, to turn ON transistors Q2, Q3, and Q6 and to turn OFF the other transistors, and at a further instant, to turn ON transistors Q2, Q4, and Q5 and to turn OFF the other transistors. In this way, the direct-current electric power supplied from the battery 14 is converted into the alternating-current electric power and supplied to the motor 10. It is of course possible that two transistors on source-side and on one transistor on sink-side may be simultaneously turned ON.

Diodes D1 to D6 connected in parallel to corresponding transistors Q1 to Q6 are commutation diodes and form a diode bridge.

An output torque of the motor 10 can be controlled by controlling the electric power conversion by the inverter 12. As such control means, an ECU (electronic control unit) 16 and a driver 18 are provided. When controlling the output torque of the motor 10, the ECU 16 inputs an acceleration signal showing an amount of depression of the accelerator pedal or a brake signal showing an amount of depression of a brake pedal. The acceleration signal designates a request for acceleration or starting from the driver, while the brake signal designates a request for braking or parking from the driver. The ECU 16 determines a torque to be output from the motor 10, in other words, a reference torque, in accordance with the acceleration or brake signal and by referring to a rotational speed or a rotor angular position (rotor angle) of the motor 10 obtained from a rotation sensor 20 attached on the motor 10. Several reasons exist for the ECU 16 to refer to the output of the rotational sensor 20. One such reasons is that it is required to limit a maximum output torque of the motor 10 with reference to an isoefficiency curve in a region with a higher rotational speed of the motor 10, for maintaining an electric power efficiency of the motor 10 at a satisfactory value.

In the ECU 16, a current required for realizing a determined reference torque as an output torque of the motor 10, that is, reference currents Iu, Iv, and Iw for respective phases U, V, and W of the motor 10, are determined with respect to each U, V, and W of the motor 10 in accordance with the reference torque. At this time, the ECU 16 determines the reference currents Iu, IV, and Iw so that an exciting magnetic flux generated in the motor 10 comes to the predetermined values in order to raise power efficiency of the motor 10. The ECU 16 also refers to information obtained from the rotational sensor 20 at the time of decision of the reference Currents Iu, Iv, and Iw so that a current flowing through each winding of the motor 10 is alternated depending on alternation of the magnetic field inside the motor 10. The driver 18 generates switching signals for respective transistors Q1 to Q6 to control the turning ON/OFF of each transistor Q1 to Q6 constituting the inverter 12, depending on the reference currents Iu, Iv, and Iw so that the transistors forming a pair do not turn ON simultaneously.

When the thus produced torque is positive (that is, the same direction as a rotational direction of the motor 10), the motor 10 is in a power running state, i.e., a state where the vehicle is controlled to be accelerated while dissipating an electric power. In this state, since the battery 14 acts as an electric power source, the battery 14 is in a discharging state. On the contrary, when the thus produced torque is negative (that is, a reverse direction to the rotational direction of the motor 10), then the motor 10 comes to a regenerative state, in which a restored braking energy is output in the form of the alternating-current from the motor 10. In this state, the battery 14 is charged by the electric power which is converted from the alternating-current to the direct-current by the diodes of the inverter 12.

In FIG. 1, further an electrical leakage detector 22 is provided between a positive-side terminal (+) and a negative-side terminal (−) of the battery 14. The electrical leakage detector 22 incorporates, for example, two detecting resistances which are connected in series With each other between the positive-side terminal (+) and the negative-side terminal (−) of the battery 14. The detecting resistances are omitted in the drawing because it is considered that persons skilled in the art can satisfactorily implement them with reference to this explanation. A connecting position of these detecting resistances is grounded on a vehicle body 28. Thus, when the electrical leakage arises in the motor 10, as shown and explained later in FIG. 4, an electric path is produced as the positive-side terminal (+) of the battery 14→the source-side transistors→the motor 10→the leakage position of the motor→the vehicle body 28→the grounded position of detecting resistances→the sink-side detecting resistance→negative-side terminal (−) of the battery 14, or as the positive-side terminal (+) of the battery 14→the source-side detecting resistance→the grounded position of detecting resistances→the vehicle body 28→the motor 10 leakage position→the motor 10→the sink-side transistors→negative-side terminal (−) of battery 14. The electrical leakage detector 22, upon occurrence of the current path through the inverter 12 and the vehicle body 28, detects a current flowing through the current path as a potential variance in the detecting resistance, and supplies the resultant to the ECU 16 as a signal. The ECU 16 executes a necessary countermeasure for an electrical leakage depending on the signal supplied from the electrical leakage detector 22.

The system construction shown in FIG. 1 features that the electrical leakage detector 22 is allowed to detect the presence of such leakage in the motor 10 when the ECU 16 stops the motor 10, and in particular features the contents of control for the inverter 12. For this purpose, the ECU 16 has inputted thereto, in addition to the information as described, vehicle speed information showing a vehicle speed, and shift information showing a shift position, and further supplies, as required, a shutdown signal SHUTDOWN (2) for the driver 18. The shutdown signal SHUTDOWN (2) is a signal for turning OFF all the transistors Q1 to Q6 simultaneously.

Figure 2:
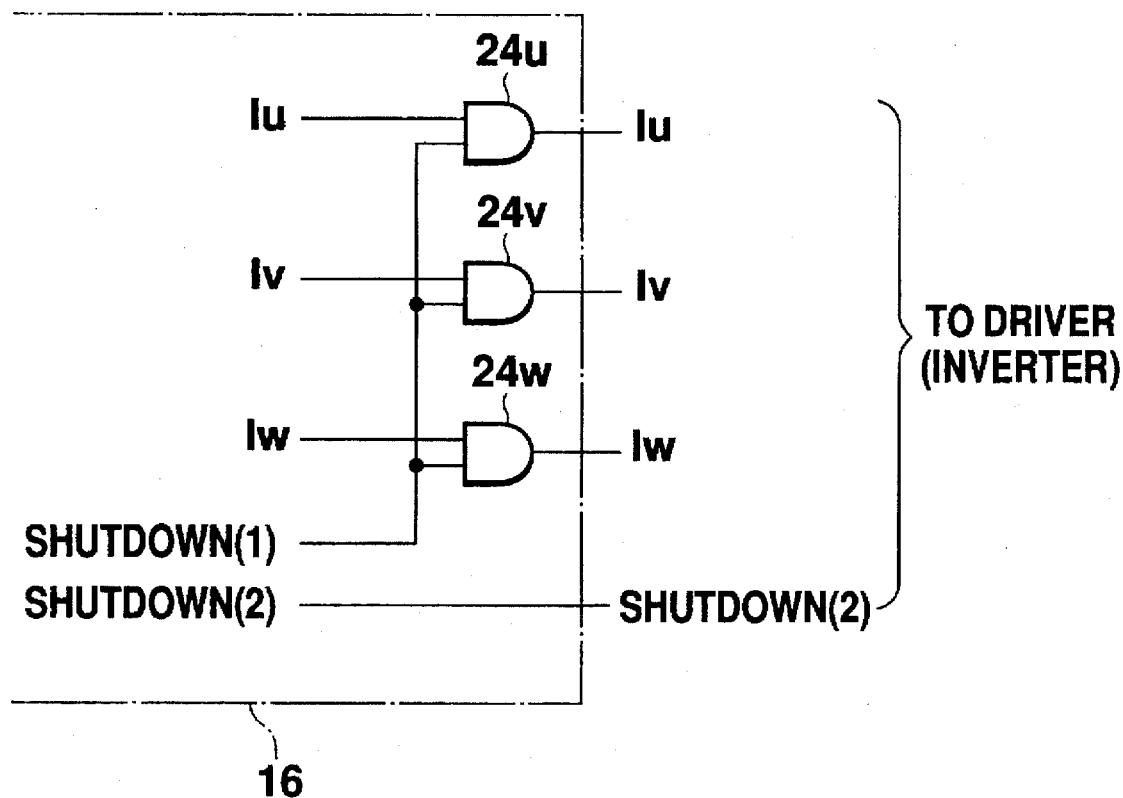
FIG. 2 is a circuit diagram showing the construction of an ECU output unit in a first embodiment.

FIG. 2 shows a partial construction of an output unit of the ECU 16. The construction as shown in the drawing is required for controlling the inverter 12 relating to the electrical leakage detection by using shutdown signals SHUTDOWN (1) and (2). As in the drawing, the output unit of the ECU 16 includes three AND gates 24*u*, 24*v*, and 24*w*. Each of the AND gates 24*u*, 24*v*, and 24*w* receives as an input one of the reference currents Iu or Iv or Iw while each AND gate receives a common input SHUTDOWN (1). The shutdown signal SHUTDOWN (1) is a signal for turning ON all the source-side transistors Q1, Q3, and Q5 simultaneously, and for turning OFF all the sink-side transistors Q2, Q4, and Q6 at the same time. Alternatively, the shutdown signal SHUTDOWN (1) may preferable be made a signal for turning ON all the sink-side transistors Q2, Q4, and Q6 simultaneously and for turning OFF all the source-side transistors Q1, Q3, and Q5 at the same time.

Outputs of respective AND gates 24*u*, 24*v*, and 24*w* are supplied to the driver 18 as reference currents Iu, Iv, and Iw. Therefore, when the shutdown signal SHUTDOWN (1) is an H value, the reference currents Iu, Iv, and Iw generated in the ECU 16 are supplied to the driver 18 as they are, and when the shutdown signal SHUTDOWN (1) is an L value, the reference currents Iu, Iv, and Iw are forced to be set to an L value. When the reference currents Iu, Iv, and Iw are set to an L value, the driver 18 controls to turn ON all the source-side transistors Q1, Q3, and Q5 (or all the sink-side transistors Q2, Q4, and Q6), and to turn OFF the remaining transistors.

When the shutdown signal SHUTDOWN (2) is an H value, the driver 18 controls the inverter 12 in accordance with the reference currents Iu, Iv, and Iw output from the AND gates 24*u*, 24*v* and 24*w*. When the shutdown signal SHUTDOWN (2) is an L value, the driver 18 turns OFF all the transistors Q1 to Q6 regardless of the reference currents.

Figure 3:
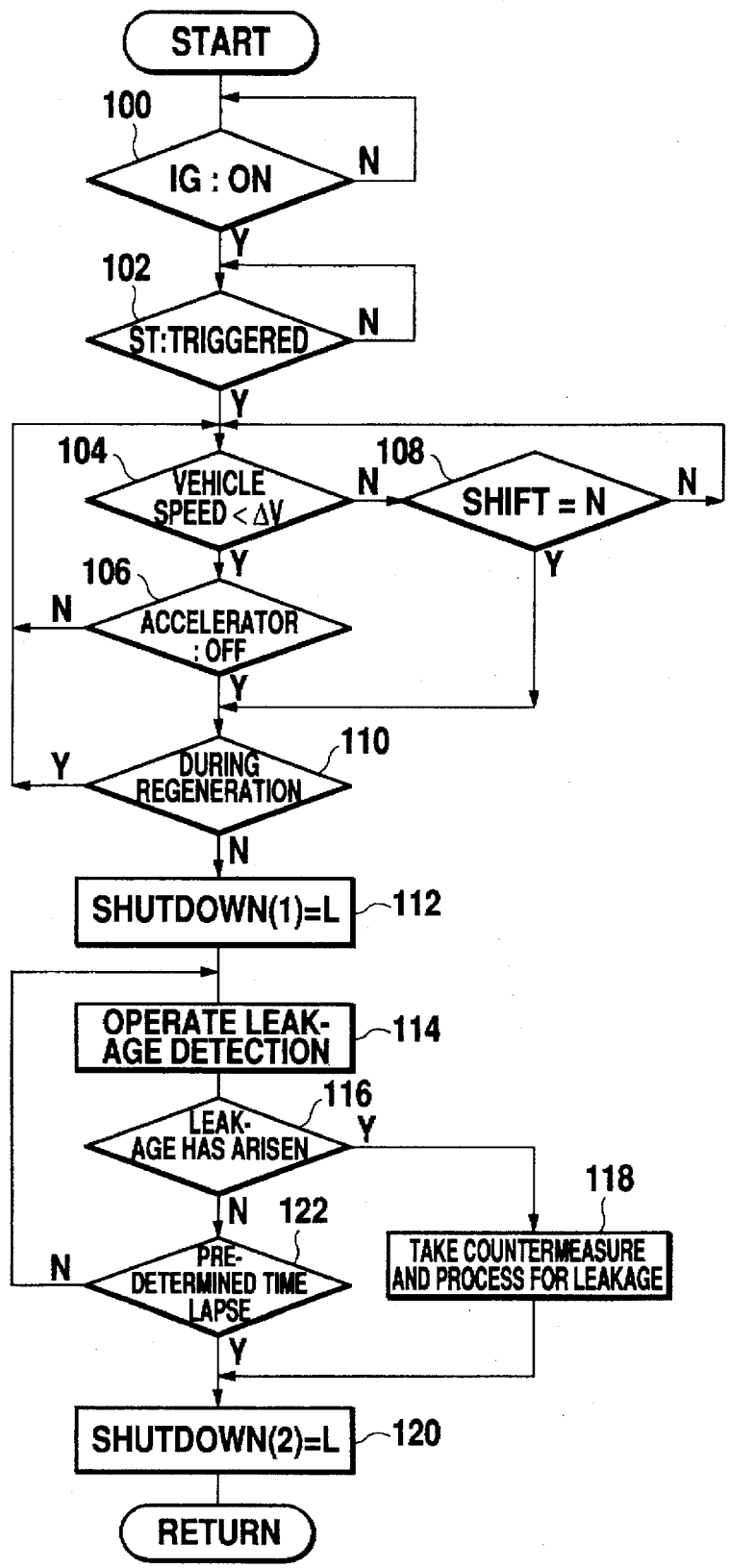
FIG. 3 is a flow chart showing an operation flow of an ECU in the first embodiment.

FIG. 3 shows an operation flow of the ECU 16 in the first embodiment according to the invention. This embodiment features controlling the inverter 12 relating to the electrical leakage detection using the shutdown signals SHUTDOWN (1) and (2). In FIG. 3, an operation without direct relationship to the electrical leakage detection, for example, an operation such as control of the output torque of the motor 10, is omitted. The operation of this omitted part can easily be understood by those skilled in the art in accordance with the description in the present specification of the application or on the basis of general technical knowledge.

As shown in the drawing, in the present embodiment, the ECU 16 is first in standby mode until an ignition (IG) signal is turned ON (100). When the IG signal is turned ON depending on a key switch operation or the like of the vehicle driver, the ECU 16 performs control of a junction box or the like (not shown) to connect the battery 14 to the inverter 12. In this manner, electric power is supplied from the battery 14 to the inverter 12. In addition, the ECU 16 inserts and arranges the electrical leakage detector 22 into the battery 14 by controlling the junction box. Here, the junction box includes a set of contactors, including electric power lines relating to electric appliances mounted on the vehicle, which is provided for collectively opening and closing connections between the electric power lines on the vehicle. The junction box includes, for example, a contactor for opening or closing a connection of the battery 14 with the inverter 12, or a contactor for opening or closing connection of the electrical leakage detector 22 with the inverter 12. The ECU 16 is further in standby mode until a starter (ST) signal is triggered (102), and when the ST signal is triggered, the ECU 16 commences control of the inverter 12 by the method described, that is, the control by the reference torque.

After the ST signal is triggered, the ECU 16 executes operations on and after step 104. In steps 104 to 110, the ECU 16 determines whether or not a detection of the electrical leakage in the motor 10 may preferably be performed, in other words, it is determined in the steps 104 to 110 whether or not all the source-side transistors Q1, Q3, and Q5 (or all the sink-side transistors Q2, Q4, and Q6) may preferably be turned ON. In this embodiment, only when all the source-side transistors Q1, Q3, and Q5 (or all the sink-side transistors Q2, Q4, and Q6) may preferably be turned ON, is control (112 to 120) relating to the electrical leakage detection, as described later, executed.

Firstly, the ECU 16 determines whether or not a speed of the vehicle is less than a predetermined extremely small value Δv, namely whether or not the vehicle speed is substantially equal to 0 (104). If the vehicle speed is substantially equal to 0, i.e. the vehicle is not in a running state, then torque control of the motor 10 is unnecessary, and thus, no disturbance appears even if shutdown control of the inverter 12 is performed in relation to the electrical leakage detecting operation as described later. Accordingly, when the vehicle speed is determined to be substantially 0, the ECU 16 proceeds to step 112. However, if the vehicle is now intending to start running or braking, a priority must be given for ordinary torque control in accordance with the acceleration or braking signal rather than for shutdown control relating to the electrical leakage detecting operation which will be described later. For this reason, even with a vehicle speed of substantially 0, when the accelerator is not turned OFF (106) or when the motor 10 is to be braked by regeneration braking (110), then the control does not proceed step 112 and after. Steps 116 and 110 are achieved by referring to the acceleration or braking signal.

In the case where a shift position is N (neutral) although a vehicle speed is not substantially equal to 0 (108), the ECU 16 proceeds to step 110. The reason why transfer to step 112 is allowed through step 110 when the shift position is N is that, in such a situation, the vehicle driver is not considered to intend running of the vehicle. The reason that the control proceeds to step 110 and not directly to step 112, stems from the fact that the regeneration braking operation is continued even after the vehicle driver switches a shift position to N from D (drive) etc.

In step 112, the ECU 16 sets the shutdown signal SHUTDOWN (1) to an L value. When the shutdown signal SHUTDOWN (1) becomes an L value, as shown in FIG. 2, the reference currents Iu, Iv, and Iw supplied from the ECU 16 to the driver 18 are each forced to an L value, thus all the source-side transistors Q1, Q3, and Q5 (or sink-side transistors Q2, Q4, and Q6) are turned ON and the remaining transistors are turned OFF.

In this arrangement as it is, the ECU 16 reads an output signal from the electrical leakage detector 22 (114). The output signal from the electrical leakage detector 22 is a signal designating whether or not an electrical leakage arises in the motor 10.

Figure 4:
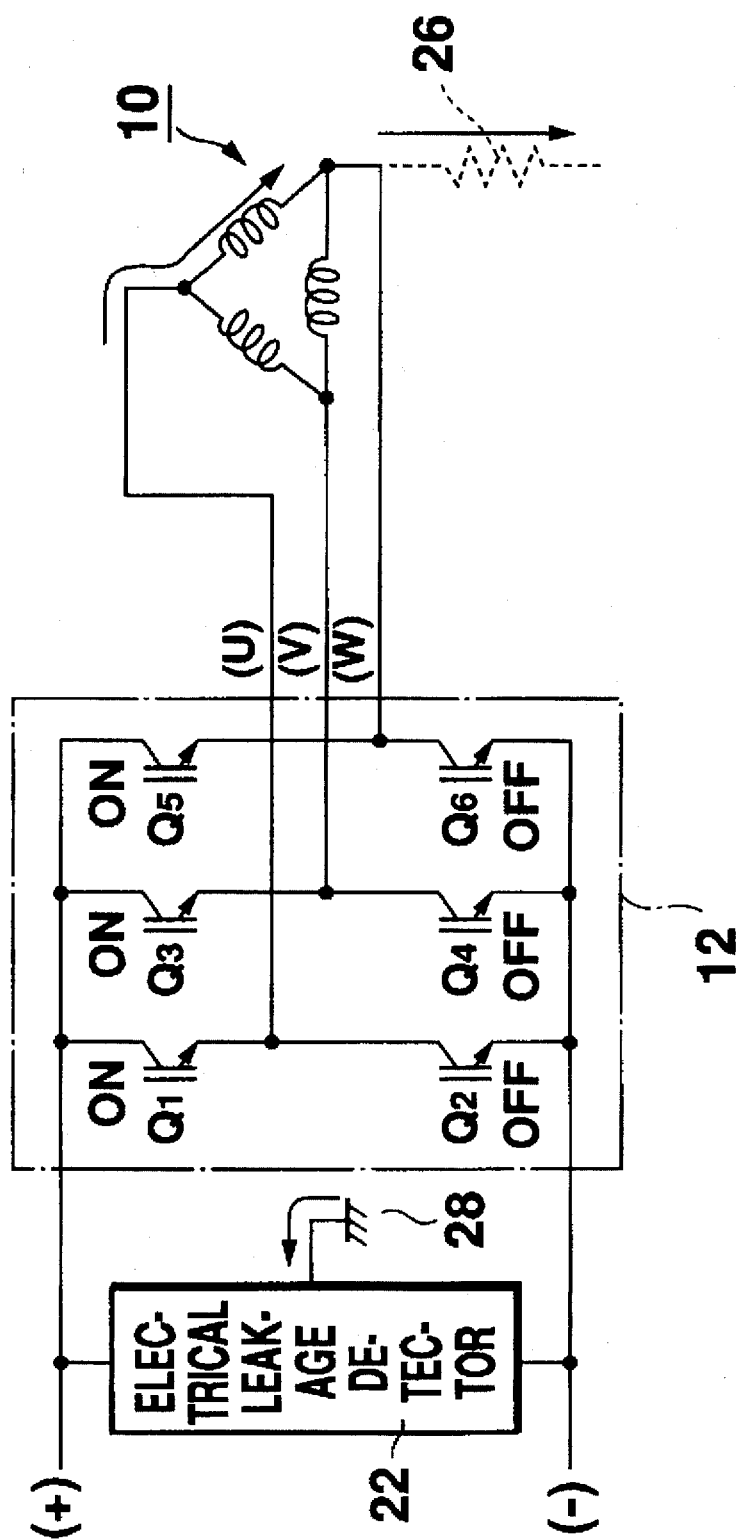
FIG. 4 is a circuit diagram showing a principle of detecting a leakage of electricity generated in a motor.

Here, it is assumed that the driver 18 controls all the source-side transistors Q1, Q3, and Q5 to turn ON and all the sink-side transistors Q2, Q4, and Q6 to turn OFF, as shown in FIG. 4 in response to the shutdown signal SHUTDOWN (1) having a L value. At this time, if electrical leakage has not arisen in the motor 10, since all the sink-side transistors Q2, Q4, and Q6 are turned OFF, a current flowing through the source-side detecting resistance of the electrical leakage detector 22 is balanced with a current flowing through the sink-side detecting resistance of the same. The electrical leakage detector 22 detects this balanced situation, and considers that electrical leakage has not arisen in the motor 10. On the contrary, if electrical leakage arises in the motor 10, a current path is produced, namely, the battery 14 positive-side terminal (+)→the source-side transistors→the motor 10→the motor leakage position 26→the vehicle body 28→the detecting resistance grounded position→the sink-side detecting resistance→the battery 14 negative-side terminal (−). With a current flowing along such a path, a current flowing through the source-side detecting resistance of the electrical leakage detector 22 is not balanced with a current flowing through the sink-side detecting resistance, so that a voltage generated in each of the detecting resistances is different from each other and from a predetermined value, or a difference greater than a predetermined value arises in voltages generated in both detecting resistances. The electrical leakage detector 22 supplies a signal relating to such a voltage variance to the ECU 16.

In the ECU 16, in accordance with the signal supplied from the electrical leakage detector 22, it is determined whether or not electrical leakage arises in the motor 10 (116), and if it is determined that such leakage exists, then after executing a required countermeasure and process for the electrical leakage, for example, generation of information or an alarm is performed (118), the shutdown signal SHUTDOWN (2) is controlled to an L value (120). When the shutdown signal SHUTDOWN (2) becomes an L value, the transistors Q1 to Q6 constituting the inverter 12 are all turned OFF. To prove with a certain degree of accuracy that no leakage arises, the operations of steps 114 and 116 are repeated until a predetermined time lapses (122), and if the result that the electrical leakage has arisen is not obtained, even after the predetermined time lapse, the ECU 16 similarly controls the shutdown signal SHUTDOWN (2) to an L value.

According to the present embodiment, even if electrical leakage occurs in the alternating-current motor 10 used as a vehicle driving motor, such electrical leakage can be suitably detected by the electrical leakage detector 22 provided on the battery 14 side.

In a situation where the motor 10 is controlled depending on the reference torque, to generate an alternating magnetic field in the motor 10, the transistors Q1 to Q6 forming the inverter 12 are ordinarily switched ON/OFF at a frequency of between several kHz and several tens of kHz. Thus, when intending to detect the electrical leakage in a situation of the motor 10 being controlled in accordance with the reference torque, an inverter switching state is gradually varied, this therefore barely secures a conducting time sufficient to suitably perform the electrical leakage detection. When detecting the electrical leakage in a reduced time, a performance of the electrical leakage detector 22 must be substantially upgraded to distinguish the unbalanced current from noise, which results in a complicated construction and a demerit in cost performance. In addition, at the time during which no current is supplied to the motor 10, for example, when the vehicle is stopped, all the transistors Q1 to Q6 are turned OFF, hence a suitable operation of the electrical leakage detection is impossible.

In this embodiment, at the instant that a predetermined condition (steps 104 to 110) is established, in other words, immediately after terminating the control of the motor 10 in accordance with the reference torque, the shutdown control using the shutdown signal SHUTDOWN (1) is intended, and therefore, the electrical leakage detection in the motor 10 can be suitably executed without misinterpreting noise as an output of the electrical leakage detector 22. This differs from a construction in which the electrical leakage detection is performed in a state where the inverter 12 is executing a high speed switching operation. In this process, no particular addition or complication of equipment and constitution are necessary.

Moreover, the electrical leakage detection in this embodiment is executed only under the limited condition where control of output torque of the motor 10 is not required, so the detection does not have any effect on the vehicle running. For example, the electrical leakage of the motor 10 is detected under such a condition as the vehicle being stopped due to a red traffic light or the like (104), the vehicle driver turning OFF the accelerator (106) or regeneration braking of the motor 10 is not performed (110), and also under the condition that the vehicle is not stopped (104) but a shift position is N (108) and the motor 10 is not in a regeneration braking state (110). Therefore, an output torque (power running torque and regeneration braking torque) of the motor 10 is controlled without being affected by any disturbances.

Further, at the instant that the shutdown control using the shutdown signal SHUTDOWN (1) is completed, the shutdown control using the shutdown signal SHUTDOWN (2) is executed, so that the control thereby proceeds rapidly to a state where all the transistors Q1 to Q6 are turned OFF.

The explanation as described above was that, when the shutdown signal SHUTDOWN (1) becomes an L value, then the reference currents Iu, Iv, and Iw also become an L value, and when the shutdown signal SHUTDOWN (2) becomes an L value, then all the transistors Q1 to Q6 are turned OFF. However, H/L reversible logic may be used for the logic of the shutdown signals SHUTDOWN (1) and (2). Instead of making the decision of the vehicle speed in step 104, a decision using a rotational speed of the motor detected by the rotational sensor 20 may preferably be performed. When making this decision, the same effects as described before can be obtained. For the construction and detecting principle of the electrical leakage detector 22, the prior art can be applied and employed, and thus the present invention is not limited to the construction and principle exemplified in the former description.

Figure 5:
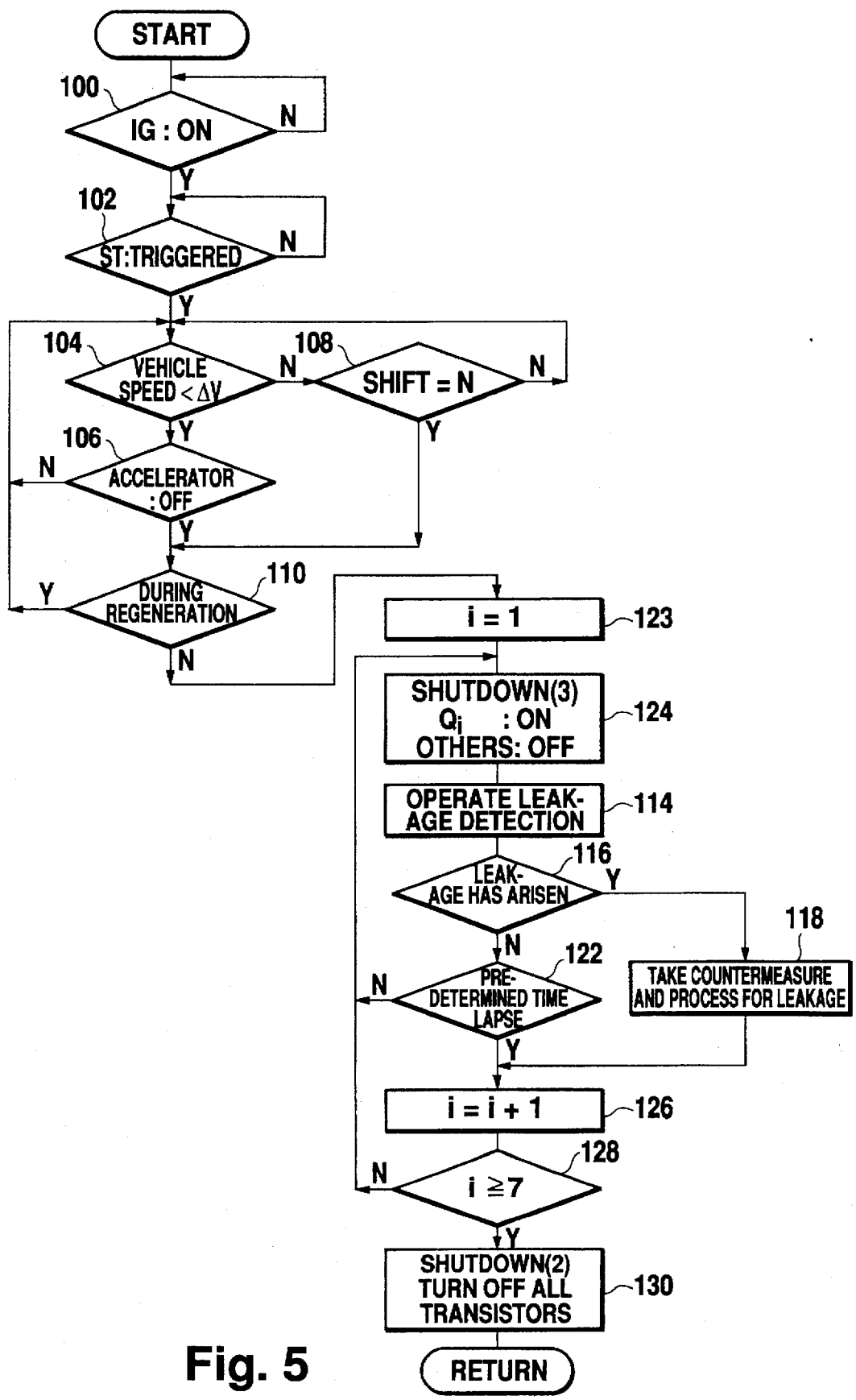
FIG. 5 is a flow chart showing an operation flow of an ECU in a second embodiment.

FIG. 5 shows an operation flow of the ECU 16 in a second embodiment according to the invention. Since this embodiment can be implemented using substantially the same equipment and construction as the first embodiment, the construction shown in FIG. 1 will be assumed for the explanation as hereinafter described. However, in this embodiment, a shutdown signal SHUTDOWN (3) is used instead of the shutdown signal SHUTDOWN (1), and it is therefore noted that the ECU 16 has a function which is capable of supplying the shutdown signal SHUTDOWN (3) to the driver 18. The shutdown signal SHUTDOWN (3) is a signal for selecting one of the transistors Q1 to Q6 at a time, and for cyclically turning it ON/OFF. An operation shown in FIG. 5 is realized using the shutdown signal SHUTDOWN (3).

Also in this embodiment, the ECU 16 executes a decision operation relating to steps 104 to 110. In steps 104 to 110, it is determined that the electrical leakage detection is preferable, thereafter, the ECU 16 initially sets "i" to 1 (123). After that, the ECU 16 outputs the shutdown signal SHUTDOWN (3) to the driver 18, which turns ON the ith transistor Qi and turns OFF the other transistors (124). Depending on this, the driver 18 executes control of transistors Q1 to Q6.

At that time, when an electrical leakage does not arise in the motor 10, since the transistors of the inverter 12 are turned OFF, except for the ith transistor Qi, a current path through the inverter 12 and the vehicle body 28 is not established. In contrast, when the electrical leakage occurs in the motor 10, then in the case of the transistor Qi located on the source-side a path is produced from the battery 14 positive-side terminal (+)→the source-side transistor Qi→the motor 10→the electrical leakage position 26 of the motor→the vehicle body 28→the detecting resistance grounded position→the sink-side detecting resistance→the battery 14 negative-side terminal (−), and in the case of the transistor Qi on sink-side, a path is produced from the battery 14 positive-side terminal (+)→the source-side etecting resistance→the detecting resistance grounded position→the vehicle body 28→the motor 10 electrical leakage position 26→the motor 10→the sink-side transistor Qi→the battery 14 negative-side terminal (−). As a consequence, the electrical leakage detection can be made by operating the electrical leakage detector 22 in the same manner as in the first embodiment.

The ECU 16 inputs an output of the electrical leakage detector 22 (114), and determines a presence of electrical leakage in the motor 10 (116). After it has been determined that the electrical leakage is present, and the countermeasure and process in response to such a decision of electrical leakage have been executed (118), if electrical leakage is not found even after a predetermined time has elapsed (122), then the ECU 16 adds 1 to "i" (126), and returns to step 124. An operation on and after step 124 is repeatedly executed until "i" becomes equal to or greater than 7 (126). On completion of such reiteration, the ECU 16 outputs the shutdown signal SHUTDOWN (2) to the driver 18 in order to turn OFF all the transistors Q1 to Q6 (130).

In this embodiment, all of the source-side transistors Q1, Q3, and Q5 (or the sink-side transistors Q2, Q4, and Q6) are therefore not turned ON at the same time as the remaining transistors are turned OFF. In this embodiment, on detecting the electrical leakage, only one transistor from among the six transistors Q1 to Q6 is turned ON at any one time, and the other transistors are turned OFF. While "i" is being incremented in step 123, step 124 is executed at the six times, and thus the transistors to be turned ON are alternately varied. Also by such an operation, the electrical leakage detection in the motor 10 can be suitably executed. In this connection, the number of transistors to be alternately turned ON/OFF may preferable be limited to three on the source-side, where all the sink-side transistors are turned OFF. On the contrary, the number of transistors to be alternately turned ON/OFF may preferable be limited to three on the sink-side, where all the source-side transistors are turned OFF.

Figure 6:
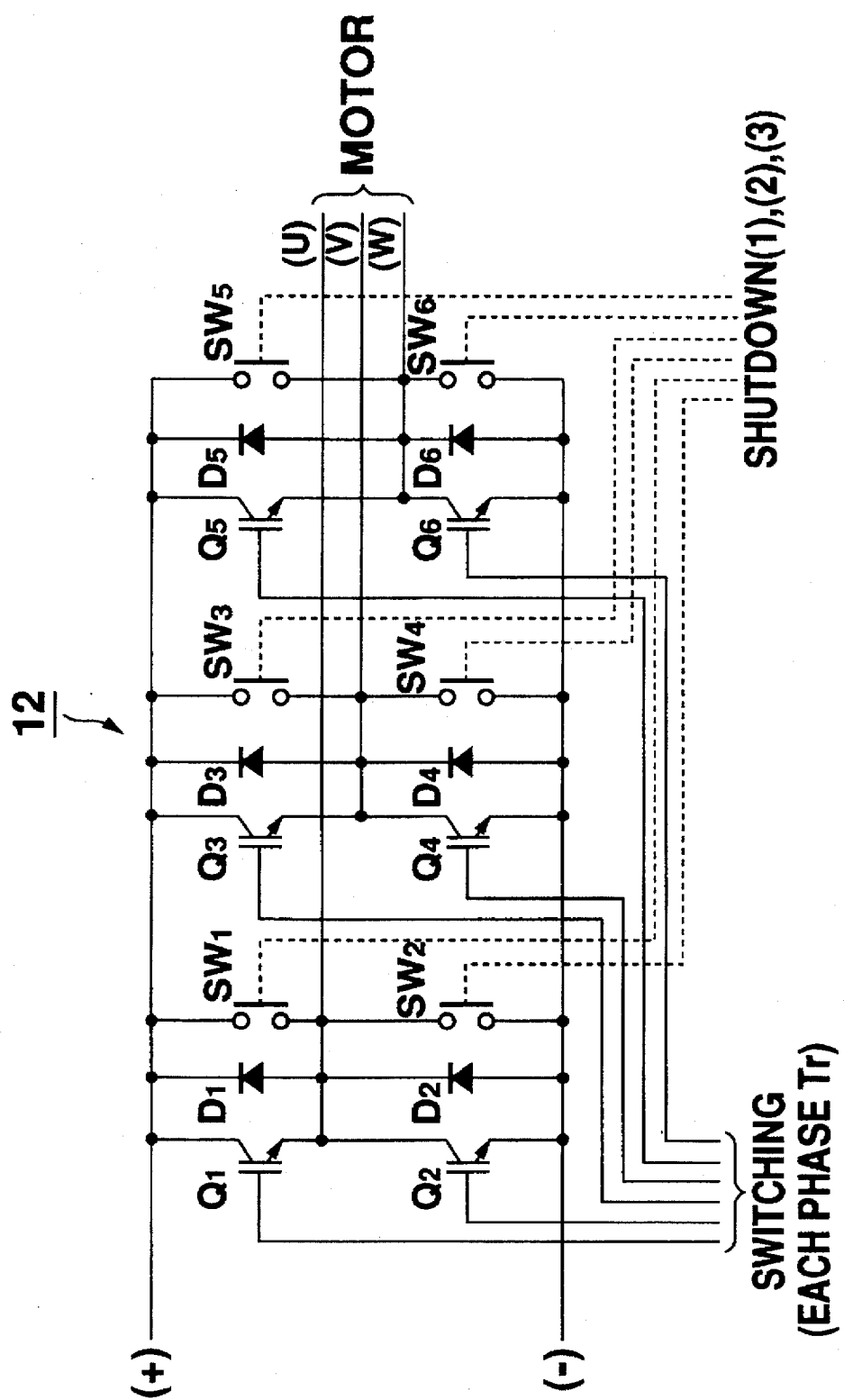
FIG. 6 is a circuit diagram showing the construction of an inverter in a third embodiment.

FIG. 6 shows a construction of an inverter 12 in a third embodiment according to the invention. Also, this embodiment can be realized using the same equipment and construction as in the first and second embodiments, shown in FIG. 1. However in this embodiment, contact points SW1 to SW6 are provided between collectors and emitters of respective transistors Q1 to Q6. In the respective embodiments as formerly described, the shutdown control is executed as a gate voltage control of the transistors Q1 to Q6 by the driver 18. On the contrary, in this embodiment, the shutdown control is executed as a control of the contact points SW1 to SW6 by the ECU 16 and the driver 18. The sequence of this shutdown control may preferable be made that of the first embodiment or that of the second embodiment. Each of the contact points SW1 to SW6 is turned ON/OFF by the shutdown signals SHUTDOWN (1), (2), or (3) as formerly described. Thus, by performing the same control as in the respective embodiments by using the structured inverter 12, the effect produced in the respective embodiments as described can be obtained. However, the circuit construction of the inverter 12 becomes complicated and larger in size.

As has been described above, because at least one transistor from among the transistors Q1 to Q6 constituting the inverter 12 is turned ON and the other transistors are turned OFF when stopping the vehicle running motor 10, when detecting the occurrence of electrical leakage in the running motor 10 by the electrical leakage detector 22, provided on the battery 14 side as viewed from the inverter 12, the present invention is capable of suitably detecting a leakage of electricity under the condition that a high speed switching of the inverter 12 is not performed, and hence, the misinterpretation of noise is prevented, as well as complication of the equipment structure. At the time of detection, a driving current forming an alternating magnetic field does not flow in the vehicle driving motor 10, which securely prevents the vehicle from moving upon detection of the electrical leakage. In the foregoing explanation, IGBTs are used as the transistors Q1 to Q6. However, the invention is not limited to such a transistor. According to the invention, different transistors or other alternative kinds of switching element may be utilized.

According to the invention, there can be realized an arrangement such that, by shutdown control, all the source-side transistors Q1, Q3, and Q5 are turned ON and all the sink-side transistors Q2, Q4, and Q6 are turned OFF or all the sink-side transistors Q2, Q4, and Q6 are turned ON and all the source-side transistors Q1, Q3, and Q5 are turned OFF. Thereby, the effect and result as formerly described can be achieved without any particular additional equipment and construction such as the contact points SW1 to SW6 in the third embodiment. As shown and described in the first embodiment, it is not necessary for the transistors of the ON side, whether it is the source-side or the sink-side, to all be turned ON at the same time. As shown in the second embodiment, the transistors to be turned ON are alternatively changed to detect the electrical leakage, which also brings about the same effect.

According to the invention, after terminating the detection of electrical leakage, all the transistors Q1 to Q6 are controlled to an OFF state by the shutdown signal SHUTDOWN (2). This makes it possible to switch to the motor stop state, as is the case of the conventional example, after achieving the electrical leakage detection.

What is claimed is:

1. A method of detecting a leakage of electricity, which is executed in an electric vehicle, the electric vehicle comprising a battery, an alternating-current motor that is a driving source of the electric vehicle, and an electric power conversion equipment which is inserted between the battery and the alternating-current motor and executes electric power conversion required for power running or regeneration braking of the electric vehicle, the method of detecting a leakage of electricity comprising:

a first detecting step of detecting a state where the electric power conversion is unnecessary;

a step of forming, in a case where it is detected in said first detecting step that the electric power conversion is unnecessary, an electrical path which includes the battery, the electric power conversion equipment, and the alternating-current motor and which maintains an open status as long as the alternating-current motor does not generate the leakage of electricity;

a second detecting step of detecting that a current flows in the electrical path after the electrical path is formed; and a step of determining that, in a case where it is detected in said second detecting step that a current flows in the electrical path, the electrical path is closed by an electrical leakage path produced in the alternating-current motor.

2. A method as claimed in claim 1, wherein the electric power conversion is considered to be unnecessary when a speed of the electric vehicle is substantially equal to 0.

3. A method as claimed in claim 2, wherein the electric power conversion is considered to be necessary in a case where any one of acceleration, starting, or braking is required for the electric vehicle even when the speed of the electric vehicle is substantially equal to 0.

4. A method as claimed in claim 2, wherein the electric power conversion is considered to be unnecessary in a case where running is not required for the electric vehicle, even when the speed of the electric vehicle is substantially not equal to 0.

5. A method as claimed in claim 4, wherein the electric power conversion is considered to be necessary when braking is required for the electric vehicle even in a case where the speed of the electric vehicle is not substantially equal to 0 and no running for the electric vehicle is required.

6. A method as claimed claim 1, wherein a countermeasure and process for the leakage of electricity is executed when the electrical path is determined as being closed.

7. A method as claimed in claim 1, wherein the electric power conversion is prohibited when the electrical path is determined as being closed.

8. A method as claimed in claim 1, wherein a presence of a current flowing in the electrical path is observed within a predetermined time limit when detecting that a current flows in the electrical path.

9. A method as claimed in claim 8, wherein the electric power conversion is prohibited when it is not detected that a current flows in the electrical path in spite of observing the presence of current flowing in the electrical path within a predetermined time limit.

10. A method as claimed in claim 1, wherein the battery has a positive-side terminal and a negative-side terminal;

the electric vehicle includes an electrical leakage detector which is at least connected to the negative-side terminal and grounded to a vehicle body of the electric vehicle;

the alternating-current motor has a plurality of phase terminals;

the electric power conversion equipment includes, a plurality of source-side switching elements each provided for one of said plurality of phase terminals in order to open and close a connection of the positive-side terminal and a corresponding one of said plurality of phase terminals, and plurality of sink-side switching elements each provided for one of said plurality of phase terminals in order to open and close a connection of the negative-side terminal and a corresponding one of said plurality of phase terminals; and wherein the step of forming the electrical path includes the step of providing the electrical path from the vehicle body to the alternating-current motor sequentially through the electrical leakage detector, the negative-side terminal, the battery, the positive-side terminal, at least either one of said plurality of source-side switching elements, and at least one of said plurality of phase terminals so that the alternating-current motor and the vehicle body are electrically connected with each other by the electrical leakage path, by using at least one from among said plurality of source-side switching elements to connect the positive-side terminal to at least one of said plurality of phase terminals, and by using all of said plurality of sink-side switching elements to insulate the negative-side terminal and said plurality of phase terminals.

11. A method as claimed in claim 10, wherein, on forming the electrical path, said plurality of source-side switching elements are used to connect the positive-side terminal with all of said plurality of phase terminals.

12. A method as claimed in claim 10, wherein, on forming the electrical path, any one of said plurality of phase terminals is sequentially selected and the selected phase terminal is connected to the positive-side terminal by that one of said plurality of source-side switching elements which corresponds to the selected phase terminal.

13. A method as claimed in claim 10, wherein said plurality of source-side switching elements and said plurality of sink-side switching elements are switching elements for executing the electric power conversion.

14. A method as claimed in claim 1, wherein the battery has a positive-side terminal and a negative-side terminal;

the electric vehicle includes an electrical leakage detector which is at least connected to the positive-side terminal and grounded to a vehicle body of the electric vehicle;

the alternating-current motor has a plurality of phase terminals;

the electric power conversion equipment includes, a plurality of source-side switching elements each provided for one of said plurality of phase terminals in order to open and close a connection of the positive-side terminal and a corresponding one of said plurality of phase terminals, and a plurality of sink-side switching elements each provided for one of said plurality of phase terminals in order to open and close a connection of the negative-side terminal and a corresponding one of said plurality of phase terminals; and wherein the step of forming the electrical path includes the step of providing the electrical path from the alternating-current motor to the vehicle body sequentially through at least one of said plurality of phase terminals, at least one of said plurality of sink-side switching elements, the negative-side terminal, the battery, the positive-side terminal, and the electrical leakage detector so that the alternating-current motor and the vehicle body are electrically connected with each other by the electrical leakage path by using all of said plurality of source-side switching elements to insulate the positive-side terminal from said plurality of phase terminals, and by using at least one of said plurality of sink-side switching elements to connect the negative-side terminal with at least one of said plurality of phase terminals.

15. A method as claimed in claim 1, wherein the battery has a positive-side terminal and a negative-side terminal;

the electric vehicle including an electrical leakage detector which is connected to the positive-side terminal and the negative-side terminal through resistances and grounded to a vehicle body of the electric vehicle;

the alternating-current motor has a plurality of phase terminals;

the electric power conversion equipment includes, a plurality of source-side switching elements each provided for one of said plurality of phase terminals in order to open and close a connection of the positive-side terminal and a corresponding one of said plurality of phase terminals, and a plurality of sink-side switching elements each provided for one of said plurality of phase terminals in order to open and close a connection of the negative-side terminal and a corresponding one of said plurality of phase terminals; and the step of forming the electrical path further comprising the step of, selecting a predetermined number of switching elements from either said plurality of source-side switching elements or said plurality of sink-side switching elements so that said selected switching element or elements are sequentially replaced, and forming either, an electrical path from the vehicle body to the alternating-current motor sequentially through the electrical leakage detector, the negative-side terminal, the battery, the positive-side terminal, at least one of said plurality of source-side switching elements, and at least one of said plurality of phase terminals or an electrical path from the alternating-current motor to the vehicle body sequentially through at least one of said plurality of phase terminals, at least one of said plurality of sink-side switching elements, the negative-side terminal, the battery, the positive-side terminal, and the electrical leakage detector so that the alternating-current motor is connected to the vehicle body through the electrical leakage path by using said switching element or elements selected in said selecting step to connect the positive-side terminal or the negative-side terminal with one or ones of said plurality of phase terminals corresponding to the selected switching element or elements and by using switching element or elements non-selected in said selecting step to insulate the positive-side terminal or the negative-side terminal from one or ones of said plurality of phase terminals corresponding to the non-selected switching element or elements.

16. A method of detecting a leakage of electricity as claimed in claim 1, wherein the step of forming an electrical path comprises:

interconnecting a plurality of switching elements to form said electrical path.

17. A method of detecting a leakage of electricity as claimed in claim 16, wherein said step of forming an electrical path comprises:

sharing a plurality of switching elements for executing the electrical power conversion with switching elements interconnected to form the electrical path.

* * * * *